(12) United States Patent
Yamakawa et al.

(10) Patent No.: US 12,098,448 B2
(45) Date of Patent: Sep. 24, 2024

(54) CEMENTED CARBIDE AND CUTTING TOOL USING SAME

(71) Applicant: SUMITOMO ELECTRIC HARDMETAL CORP., Itami (JP)

(72) Inventors: Takahiro Yamakawa, Itami (JP); Kazuhiro Hirose, Itami (JP); Katsuya Uchino, Ono (JP); Tsuyoshi Yamamoto, Ono (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 0 days.

(21) Appl. No.: 17/767,443

(22) PCT Filed: Oct. 15, 2021

(86) PCT No.: PCT/JP2021/038226
§ 371 (c)(1),
(2) Date: Apr. 8, 2022

(87) PCT Pub. No.: WO2023/062818
PCT Pub. Date: Apr. 20, 2023

(65) Prior Publication Data
US 2024/0240291 A1    Jul. 18, 2024

(51) Int. Cl.
C22C 29/08    (2006.01)
B23B 27/14    (2006.01)
(Continued)

(52) U.S. Cl.
CPC ............ *C22C 29/08* (2013.01); *B23B 27/148* (2013.01); *C22C 1/051* (2013.01); *H05K 3/0047* (2013.01)

(58) Field of Classification Search
CPC ..................................................... C22C 1/051
See application file for complete search history.

(56) References Cited

U.S. PATENT DOCUMENTS

2010/0098506 A1* 4/2010 Tanaka ............... B22F 1/07
407/53
2014/0271321 A1* 9/2014 Maderud ............ C22C 1/051
419/13

FOREIGN PATENT DOCUMENTS

| CN | 105624447 A | 6/2016 |
| CN | 111088449 A | 5/2020 |

(Continued)

OTHER PUBLICATIONS

International Search Report and Written Opinion mailed on Nov. 30, 2021, received for PCT Application PCT/JP2021/038226, Filed on Oct. 15, 2021, 12 pages including English Translation.

*Primary Examiner* — Adil A. Siddiqui
(74) *Attorney, Agent, or Firm* — XSENSUS LLP

(57) ABSTRACT

A cemented carbide consists of: a first phase consisting of a plurality of tungsten carbide grains; and a second phase including cobalt, an average value of equivalent circle diameters of the tungsten carbide grains is 0.5 μm to 1.2 μm, on number basis, the tungsten carbide grains include less than or equal to 13% of first tungsten carbide grains each having an equivalent circle diameter of less than or equal to 0.3 μm, on number basis, the tungsten carbide grains include less than or equal to 12% of second tungsten carbide grains each having an equivalent circle diameter of more than 1.3 μm, in a histogram indicating a distribution of the equivalent circle diameters of the tungsten carbide grains. Fmax/Fmin is less than or equal to 7.0, Fmax/Fmin being a ratio of a maximum frequency Fmax to a minimum frequency Fmin.

8 Claims, 3 Drawing Sheets

(51) Int. Cl.
*C22C 1/051* (2023.01)
*H05K 3/00* (2006.01)

(56) References Cited

FOREIGN PATENT DOCUMENTS

| | | |
|---|---|---|
| JP | 2004-256852 A | 9/2004 |
| JP | 2007-92090 A | 4/2007 |
| JP | 2009-242181 A | 10/2009 |
| JP | 2012-52237 A | 3/2012 |
| JP | 2012-117100 A | 6/2012 |
| JP | 2021-161539 A | 10/2021 |

\* cited by examiner

CEMENTED CARBIDE AND CUTTING TOOL USING SAME

CROSS-REFERENCE TO RELATED APPLICATION

The present application is based on PCT filing PCT/JP2021/038226, filed Oct. 15, 2021, the entire contents of which are incorporated herein by reference.

TECHNICAL FIELD

The present disclosure relates to a cemented carbide and a cutting tool using the cemented carbide.

BACKGROUND ART

In the case of formation of holes in a printed circuit board, holes each having a small diameter of less than or equal to φ1 mm are mainly formed. Therefore, as a cemented carbide used in a tool such as a small-diameter drill, a so-called fine-grain cemented carbide has been used in which a hard phase consists of tungsten carbide grains having an average grain size of less than or equal to 1 μm (for example, Japanese Patent Laying-Open No. 2007-92090 (PTL 1), Japanese Patent Laying-Open No. 2012-52237 (PTL 2) and Japanese Patent Laying-Open No. 2012-117100 (PTL 3)).

CITATION LIST

Patent Literature

PTL 1: Japanese Patent Laying-Open No. 2007-92090
PTL 2: Japanese Patent Laying-Open No. 2012-52237
PTL 3: Japanese Patent Laying-Open No. 2012-117100

SUMMARY OF INVENTION

A cemented carbide consists of: a first phase consisting of a plurality of tungsten carbide grains, and a second phase including cobalt, wherein
   the cemented carbide includes more than or equal to 78 volume % and less than 100 volume % of the first phase, and more than 0 volume % and less than or equal to 22 volume % of the second phase,
   an average value of equivalent circle diameters of the tungsten carbide grains is more than or equal to 0.5 μm and less than or equal to 1.2 μm,
   on number basis, the tungsten carbide grains include less than or equal to 13% of first tungsten carbide grains each having an equivalent circle diameter of less than or equal to 0.3 μm,
   on number basis, the tungsten carbide grains include less than or equal to 12% of second tungsten carbide grains each having an equivalent circle diameter of more than 1.3 μm,
   in a first range of a histogram indicating a distribution of the equivalent circle diameters of the tungsten carbide grains, Fmax/Fmin is less than or equal to 7.0, Fmax/Fmin being a ratio of a maximum frequency Fmax to a minimum frequency Fmin,
   classes on a horizontal axis of the histogram represent the equivalent circle diameters of the tungsten carbide grains, and an interval of each of the classes is 0.1 μm,
   frequencies on a vertical axis of the histogram represent, on number basis, percentages of tungsten carbide grains belonging to the respective classes with respect to all the tungsten carbide grains,
   the first range is a range in which the equivalent circle diameter of the tungsten carbide grains is more than 0.3 μm and less than or equal to 1.3 μm,
   the maximum frequency Fmax is a maximum frequency in the first range,
   the minimum frequency Fmin is a minimum frequency in the first range, and
   a content ratio of cobalt in the cemented carbide is more than 0 mass % and less than or equal to 10 mass %.

DETAILED DESCRIPTION

Figure 1:
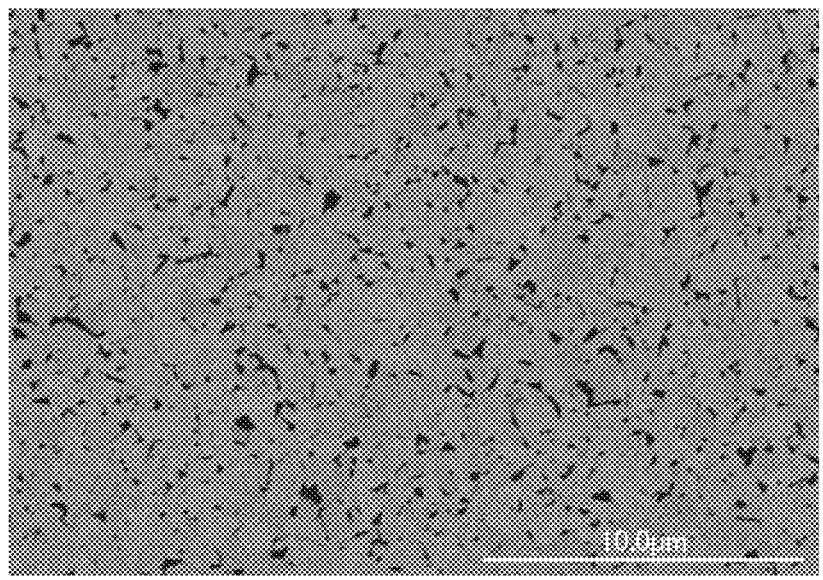
FIG. 1 is a diagram employing a photograph to show an exemplary reflected electron image of a cemented carbide of the present embodiment.

Problem to be Solved by the Present Disclosure

In recent years, in response to expansion of 5G (Fifth Generation Mobile Communication System), an amount of information has been increased. Therefore, a printed circuit board is required to have further heat resistance. In order to improve the heat resistance of the printed circuit board, a technique has been developed to improve the heat resistance of a resin or glass filler included in the printed circuit board. On the other hand, this leads to increased hardness of the printed circuit board Due to the increased hardness of the printed circuit board, the cutting edge of a drill for processing the printed circuit board tends to be worn, thus resulting in deteriorated precision in terms of a hole formation position.

In view of the above, it is an object of the present disclosure to provide: a cemented carbide by which a cutting tool having excellent processing precision can be provided in the case where the cemented carbide is used as a tool material, particularly, in the case of fine processing of a printed circuit board; and a cutting tool including the cemented carbide.

Advantageous Effect of the Present Disclosure

According to the cemented carbide of the present disclosure, a cutting tool having excellent processing precision can be provided particularly in the case of fine processing of a printed circuit board.

DESCRIPTION OF EMBODIMENTS

First, embodiments of the present disclosure are listed and described.

(1) A cemented carbide of the present disclosure is a cemented carbide consisting of: a first phase consisting of a plurality of tungsten carbide grains; and a second phase including cobalt, wherein
- the cemented carbide includes more than or equal to 78 volume % and less than 100 volume % of the first phase, and more than 0 volume % and less than or equal to 22 volume % of the second phase,
- an average value of equivalent circle diameters of the tungsten carbide grains is more than or equal to 05 μm and less than or equal to 1.2 μm,
- on number basis, the tungsten carbide grains include less than or equal to 13% of first tungsten carbide grains each having an equivalent circle diameter of less than or equal to 0.3 μm,
- on number basis, the tungsten carbide grains include less than or equal to 12% of second tungsten carbide grains each having an equivalent circle diameter of more than 1.3 μm.
- in a first range of a histogram indicating a distribution of the equivalent circle diameters of the tungsten carbide grains, Fmax/Fmin is less than or equal to 7.0, Fmax/Fmin being a ratio of a maximum frequency Fmax to a minimum frequency Fmin,
- classes on a horizontal axis of the histogram represent the equivalent circle diameters of the tungsten carbide grains, and an interval of each of the classes is 0.1 μm,
- frequencies on a vertical axis of the histogram represent, on number basis, percentages of tungsten carbide grains belonging to the respective classes with respect to all the tungsten carbide grains,
- the first range is a range in which the equivalent circle diameters of the tungsten carbide grains are more than 0.3 μm and less than or equal to 1.3 μm,
- the maximum frequency Fmax is a maximum frequency in the first range,
- the minimum frequency Fmin is a minimum frequency in the first range, and
- a content ratio of cobalt in the cemented carbide is more than 0 mass % and less than or equal to 10 mass %.

According to the cemented carbide of the present disclosure, a cutting tool having excellent processing precision can be provided particularly in the case of fine processing of a printed circuit board. In the present specification, the expression "the cutting tool has excellent processing precision" means that the cutting tool has a long tool life while maintaining excellent hole position precision. Here, the hole position precision refers to an index regarding a difference between a target position in a hole formation process and an actual hole formation position. As this difference is smaller, the hole position precision is more excellent.

(2) The cemented carbide preferably includes more than or equal to 5 volume % and less than or equal to 12 volume % of the second phase. This leads to an improved tool life.

(3) A content ratio of chromium in the cemented carbide is preferably more than or equal to 0.15 mass % and less than or equal to 1.00 mass %. This leads to an improved tool life.

(4) A percentage of the chromium with respect to the cobalt on mass basis is preferably more than or equal to 5% and less than or equal to 100%. This leads to an improved tool life.

(5) A content ratio of vanadium in the cemented carbide on mass basis is preferably more than or equal to 0 ppm and less than 2000 ppm. This leads to an improved tool life.

(6) Preferably, a difference is less than or equal to 2.5% between the maximum frequency Fmax and a frequency Fa of a class smaller by one than a class corresponding to the maximum frequency Fmax, and
- a difference is less than or equal to 2.5% between the maximum frequency Fmax and a frequency Fb of a class larger by one than the class corresponding to the maximum frequency Fmax.

This leads to a further improved tool life.

(7) A cutting tool of the present disclosure is a cutting tool having a cutting edge composed of the cemented carbide. The cutting tool of the present disclosure has excellent processing precision.

(8) The cutting tool is preferably a rotating tool for processing a printed circuit board. The cutting tool of the present disclosure is particularly suitable for fine processing of a printed circuit board.

Details of Embodiments of the Present Disclosure

Specific examples of a cemented carbide and a cutting tool in the present disclosure will be described with reference to figures. The same reference characters indicate the same or equivalent portions in the figures of the present disclosure. Further, a relation of such a dimension as a length, a width, a thickness, or a depth is modified as appropriate for clarity and brevity of the figures and does not necessarily represent an actual dimensional relation.

In the present specification, the expression "A to B" represents a range of lower to upper limits (i.e., more than or equal to A and less than or equal to B). When no unit is indicated for A and a unit is indicated only for B, the unit of A is the same as the unit of B.

Moreover, when a compound or the like is expressed by a chemical formula in the present specification and an atomic ratio is not particularly limited, it is assumed that all the conventionally known atomic ratios are included. The atomic ratio should not be necessarily limited only to one in the stoichiometric range. For example, when "WC" is described, an atomic ratio in the WC includes all the conventionally known atomic ratios.

First Embodiment: Cemented Carbide

One embodiment of the present disclosure (hereinafter, also referred to as "the present embodiment") is directed to a cemented carbide consisting of: a first phase consisting of a plurality of tungsten carbide grains; and a second phase including cobalt, wherein
- the cemented carbide includes more than or equal to 78 volume % and less than 100 volume % of the first phase, and more than 4 volume % and less than or equal to 22 volume % of the second phase,
- an average value of equivalent circle diameters of the tungsten carbide grains is more than or equal to 0.5 μm and less than or equal to 1.2 μm,
- on number basis, the tungsten carbide grains include less than or equal to 13% of first tungsten carbide grains each having an equivalent circle diameter of less than or equal to 0.3 μm,
- on number basis, the tungsten carbide grains include less than or equal to 12% of second tungsten carbide grains each having an equivalent circle diameter of more than 1.3 μm, in a first range of a histogram indicating a distribution of the equivalent circle diameters of the tungsten carbide grains, Fmax/Fmin is less than or equal to 7.0, Fmax/Fmin being a ratio of a maximum frequency Fmax to a minimum frequency Fmin, classes on a horizontal axis of the histogram represent the equivalent circle diameters of the tungsten carbide grains, and an interval of each of the classes is 0.1 μm, frequencies on a vertical axis of the histogram represent, on number basis, percentages of tungsten carbide grains belonging to the respective classes with respect to all the tungsten carbide grains, the first range is a range in which the equivalent circle diameter of the tungsten carbide grains is more than 0.3 μm and less than or equal to 1.3 μm, the maximum frequency Fmax is a maximum frequency in the first range, the minimum frequency Fmin is a minimum frequency in the first range, and a content ratio of cobalt in the cemented carbide is more than 0 mass % and less than or equal to 10 mass %.

According to the cemented carbide of the present disclosure, a cutting tool having excellent processing precision can be provided particularly in the case of fine processing of a printed circuit board Reasons for this are not clear but are presumed as described below in (i) to (vi).

(i) The cemented carbide of the present embodiment consists of: the first phase consisting of the plurality of tungsten carbide grains (hereinafter, also referred to as "WC grains"); and the second phase including cobalt, wherein the cemented carbide includes more than or equal to 78 volume % and less than 100 volume % of the first phase, and more than 0 volume % and less than or equal to 22 volume % of the second phase. Thus, the cemented carbide can have hardness and wear resistance necessary for fine processing of a printed circuit board.

(ii) In the cemented carbide of the present embodiment, the average value of the equivalent circle diameters of the WC grains is more than or equal to 0.5 μm and less than or equal to 1.2 μm. Accordingly, in a cutting tool using the cemented carbide, falling-off and wear resulting from use are less likely to occur, and a cutting edge can be maintained to have a sharp shape. Therefore, the cutting tool using the cemented carbide can have excellent processing precision. Further, the cemented carbide has an excellent transverse rupture strength, and the cutting tool using the cemented carbide can have an excellent fracture resistance.

(iii) In the cemented carbide of the present embodiment, on number basis, the WC grains include less than or equal to 13% of the first tungsten carbide grains each having an equivalent circle diameter of less than or equal to 0.3 μm. Accordingly, falling-off and wear resulting from use are less likely to occur, and the cutting edge can be maintained to have a sharp shape. Therefore, the cutting tool using the cemented carbide can have excellent processing precision.

(iv) In the cemented carbide of the present embodiment, on number basis, the WC grains include less than or equal to 12% of the second tungsten carbide grains each having an equivalent circle diameter of more than 1.3 μm. Accordingly, the cemented carbide has a high transverse rupture strength, and the cutting tool using the cemented carbide can have excellent processing precision and excellent fracture resistance.

(v) In the histogram indicating the distribution of the equivalent circle diameters of the tungsten carbide grains, Fmax/Fmin, which is the ratio of the maximum frequency Fmax to the minimum frequency Fmin, is less than or equal to 7.0. Accordingly, in the first range of more than 0.3 μm and less than or equal to 1.3 μm, the equivalent circle diameters of the WC grains are non-uniform. Therefore, the WC grains are densified and firmly adhered to each other to attain a high Young's modulus of the cemented carbide, with the result that the cutting tool using the cemented carbide is less likely to be bent during use. Further, in the cutting tool, falling-off and wear resulting from use are less likely to occur, and the cutting edge can be maintained to have a sharp shape. In view of the above, the cutting tool using the cemented carbide can have excellent processing precision.

(vi) The content of cobalt in the cemented carbide is more than 0 mass % and less than or equal to 10 mass %. Accordingly, the cemented carbide can have high hardness, can have excellent wear resistance, and can maintain excellent processing precision.

First Phase

<<Composition of First Phase>>

The first phase consists of the plurality of tungsten carbide grains. Here, the tungsten carbide grains include not only "pure WC grains (inclusive of WC in which no impurity element is contained at all and WC in which the content of the impurity element is less than a detection limit)" but also "WC grains in which the impurity element is intentionally or inevitably contained as long as the effects of the present disclosure are not impaired" The content ratio of the impurity in the first phase (when two or more elements constitutes the impurity, the total concentration thereof) is less than 0.1 mass %. The content ratio of the impurity element in the first phase is measured by ICP (inductively Coupled Plasma) Emission Spectroscopy (measurement apparatus: ICPS-8100 (trademark) provided by Shimadzu Corporation)

<<Average Value of Equivalent Circle Diameters of Tungsten Carbide Grains>>

In the present embodiment, the average value of the equivalent circle diameters of the tungsten carbide grains (hereinafter, also referred to as "average grain size of the WC grains") is more than or equal to 0.5 μm and less than or equal to 1.2 μm. In the present specification, the average value of the equivalent circle diameters of the tungsten carbide grains refers to the arithmetic average, on number basis, of the equivalent circle diameters of the WC grains measured at a surface or cross section of the cemented carbide. When the average grain size of the WC grains is more than or equal to 0.5 μm, in the cutting tool using the cemented carbide, falling-off and wear resulting from use are unlikely to occur, and the cutting edge can be maintained to have a sharp shape. Therefore, the cutting tool using the cemented carbide can have excellent processing precision. When the average grain size of the WC grains is less than or equal to 1.2 μm, the cemented carbide has excellent transverse rupture strength, and the cutting tool using the cemented carbide can have excellent fracture resistance.

The lower limit of the average grain size of the WC grains is more than or equal to 0.5 μm, and is preferably more than or equal to 0.55 μm, and is preferably more than or equal to 0.6 μm in order to improve the processing precision. The upper limit of the average grain size of the WC grains is preferably less than or equal to 1.2 μm, is preferably less than or equal to 1.1 μm, and is preferably less than or equal to 1.0 μm in order to improve the fracture resistance. The average grain size of the WC grains is more than or equal to 0.5 μm and less than or equal to 1.2 μm, is preferably more than or equal to 0.55 μm and less than or equal to 1.1 μm, and is preferably more than or equal to 0.6 μm and less than or equal to 1.0 μm.

The average value of the equivalent circle diameters of the tungsten carbide grains is measured in the following procedures (A1) to (D1).

(A1) An arbitrary surface or arbitrary cross section of the cemented carbide is mirror-finished. Examples of the mirror-finishing method include: a method of polishing with diamond paste; a method employing a focused ion beam apparatus (FIB apparatus); a method employing a cross section polisher apparatus (CP apparatus); a method employing these in combination; and the like.

(B1) The processed surface of the cemented carbide is captured in images by a scanning electron microscope ("S-3400N" provided by Hitachi High-Technologies). Three captured images are prepared. The three images are captured in different image capturing regions. Locations for the image capturing can be arbitrarily set. Conditions are as follows: an observation magnification of 5000×, an acceleration voltage of 10 kV; and a reflected electron image. FIG. 1 shows an exemplary reflected electron image of the cemented carbide of the present embodiment.

Figure 2:
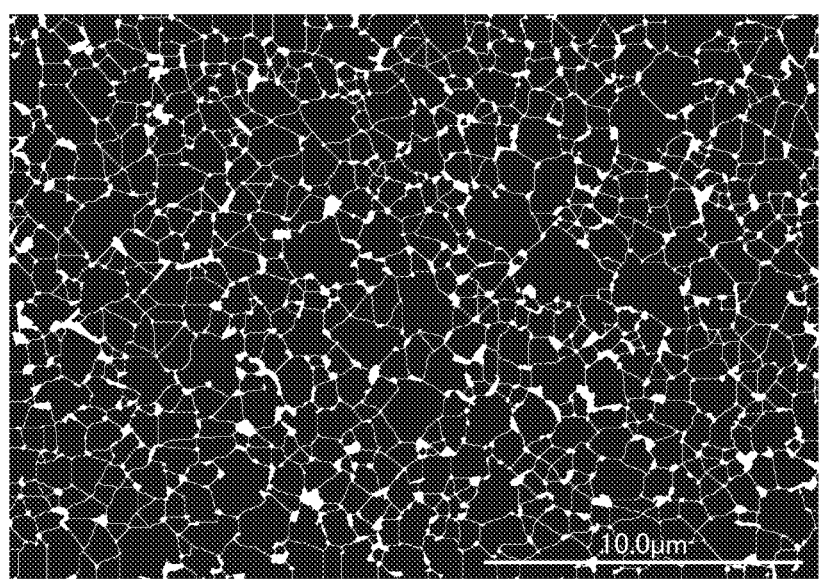
FIG. 2 is a diagram employing a photograph to show an image obtained by performing binarization processing on the reflected electron image of FIG. 1.

(C1) Each of the three reflected electron images obtained in (BI) above is loaded into a computer by image analysis software (ImageJ, version 1.51j8: https://imagej.nih.gov/ij/) and is subjected to binarization processing. The binarization processing is performed under a condition set in the image analysis software in advance by pressing the indication "Make Binary" on a computer screen after loading the image. In the image having been through the binarization processing, the first phase consisting of the tungsten carbide grains and the second phase including cobalt can be distinguished from each other by brightness/darkness of color. For example, in the image having been through the binarization processing, the first phase consisting of the tungsten carbide grains is indicated as a black region, and the second phase including cobalt is indicated as a white region FIG. 2 shows the image obtained by performing the binarization processing onto the reflected electron image of FIG. 1.

(D1) A measurement visual field having a rectangular shape with a length of 25.3 μm and a width of 17.6 μm is set in each of the obtained three images having been through the binary processing. The above-described image analysis software is used to measure the equivalent circle diameter (Heywood diameter the diameter of the circle of equal area) of each of all the tungsten carbide grains (black region) in each of the three measurement visual fields. The arithmetic average value of the equivalent circle diameters of all the tungsten carbide grains in the three measurement visual fields on number basis is calculated. In the present specification, the arithmetic average value corresponds to the average value of the equivalent circle diameters of the WC grains.

In the measurement performed by the Applicant, it has been confirmed that as long as the measurement is performed on the same sample, even when the measurement is performed a plurality of times with a selected location for the measurement visual field being changed, variation in the measurement results is small and there is no arbitrariness even with the measurement visual field set as desired.

<<Distribution of Equivalent Circle Diameters of Tungsten Carbide Grains>>

The distribution of the equivalent circle diameters of the WC grains included in the cemented carbide of the present embodiment satisfies the following conditions (a) to (c).

(a) On number basis, the tungsten carbide grains include less than or equal to 13% of the first tungsten carbide grains (hereinafter, also referred to as "first WC grains") each having an equivalent circle diameter of less than or equal to 0.3 μm.

(b) On number basis, the tungsten carbide grains include less than or equal to 12% of the second tungsten carbide grains (hereinafter, also referred to as "second WC grains") each having an equivalent circle diameter of more than 1.3 μm.

(c) In the first range of the histogram indicating the distribution of the equivalent circle diameters of the tungsten carbide grains, Fmax/Fmin is less than or equal to 7.0. Fmax/Fmin being the ratio of the maximum frequency Fmax to the minimum frequency Fmin. Here, the first range is a range in which the equivalent circle diameters of the tungsten carbide grains are more than 0.3 μm and less than or equal to 1.3 μm.

According to (a) above, falling-off and wear resulting from use are less likely to occur, and the cutting edge can be maintained to have a sharp shape. Therefore, the cutting tool using the cemented carbide can have excellent processing precision.

The percentage of the first WC grains with respect to the whole of the WC grains on number basis is less than or equal to 13%, and in order to improve processing precision, the percentage of the first WC grains with respect to the whole of the WC grains on number basis is preferably less than or equal to 11% or less than or equal to 9%, The lower limit of the percentage of the first WC grains with respect to the whole of the WC grains on the number basis is not particularly limited, but can be, for example, more than or equal to 0%, more than or equal to 2%, or more than or equal to 4%. The percentage of the first WC grains with respect to the whole of the WC grains on number basis can be more than or equal to 0% and less than or equal to 13%, more than or equal to 0% and less than or equal to 11%, more than or equal to 0% and less than or equal to 9%, more than or equal to 2% and less than or equal to 13%, more than or equal to 2% and less than or equal to 11%, more than or equal to 2% and less than or equal to 9%, more than or equal to 4% and less than or equal to 13%, more than or equal to 4% and less than or equal to 11%, or more than or equal to 4% and less than or equal to 9%.

According to (b) above, the cemented carbide has a high transverse rupture strength, and the cutting tool using the cemented carbide can have excellent fracture resistance.

The percentage of the second WC grains with respect to the whole of the WC grains on number basis is less than or equal to 12%, and in order to improve the fracture resistance, the percentage of the second WC grains with respect to the whole of the WC grains on number basis is preferably less than or equal to 11% or less than or equal to 10%. The lower limit of the percentage of the second WC grains with respect to the whole of the WC grains on number basis is not particularly limited, but can be, for example, more than or equal to 0%, more than or equal to 2%, or more than or equal to 4%. The percentage of the second WC grains with respect to the whole of the WC grains on number basis can be more than or equal to 0% and less than or equal to 12%, more than or equal to 0% and less than or equal to 11%, more than or equal to 0% and less than or equal to 10%, more than or equal to 2% and less than or equal to 12%, more than or equal to 2% and less than or equal to 11%, more than or equal to 2% and less than or equal to 10%, more than or equal to 4% and less than or equal to 12%, more than or equal to 4% and less than or equal to 11%, or more than or equal to 4% and less than or equal to 10%.

In the present specification, the percentage of the first WC grains with respect to the whole of the WC grains on number basis and the percentage of the second WC grains with respect to the whole of the WC grains on number basis are calculated in the following procedures (A2) to (C2).

(A2) In accordance with the procedures (A1) to (D1) of the method of measuring the average value of the circle-equivalent diameters of the WC grains, the circle-equivalent diameter (Heywood diameter: the diameter of the circle of equal area) of each of all the tungsten carbide grains (black region) in the three measurement visual fields is measured.

(B2) The percentage of the first WC grains each having an equivalent circle diameter of less than or equal to 0.3 µm with respect to all the tungsten carbide grains in the three measurement visual fields is calculated on number basis. In the present specification, the percentage of the first WC grains on number basis corresponds to the percentage of the first WC grains with respect to the whole of the WC grains in the cemented carbide on number basis.

(C2) The percentage of the second WC grains each having an equivalent circle diameter of more than 1.3 µm with respect to all the tungsten carbide grains in the three measurement visual fields is calculated on number basis. In the present specification, the percentage of the second WC grains on number basis corresponds to the percentage of the second WC grains with respect to the whole of the WC grains in the cemented carbide on number basis.

In the measurement performed by the Applicant, it has been confirmed that as long as the measurement is performed on the same sample, even when the measurement is performed a plurality of times with a selected location for the measurement visual field being changed, variation in the measurement results is small and there is no arbitrariness even with the measurement visual field set as desired.

According to (c) above, a difference between the numbers of the WC grains included in the respective classes is small in the first range of the histogram indicating the distribution of the equivalent circle diameters of the tungsten carbide grains That is, in the first range, the equivalent circle diameters of the WC grains are non-uniform. Therefore, the WC grains are densified and firmly adhered to each other to attain a high Young's modulus of the cemented carbide, with the result that the cutting tool using the cemented carbide is less likely to be bent during use. Further, falling-off and wear resulting from use are less likely to occur in the cutting tool, and the cutting edge can be maintained to have a sharp shape. In view of the above, the cutting tool using the cemented carbide can have excellent processing precision.

Fmax/Fmin is less than or equal to 7.0, and in order to improve processing precision, Fmax/Fmin is preferably less than or equal to 6.0 and is more preferably less than or equal to 5.0. The lower limit of Fmax/Fmin is not particularly limited, but can be, for example, more than or equal to 2.0. Fmax/Fmin can be more than or equal to 2.0 and less than or equal to 7.0, more than or equal to 2.0 and less than or equal to 6.0, or more than or equal to 2.0 and less than or equal to 5.0.

The distribution of the equivalent circle diameters of the WC grains included in the cemented carbide of the present embodiment preferably satisfies the following condition (d).

(d) A difference (Fmax−Fa) is less than or equal to 2.5% between the maximum frequency Fmax and a frequency Fa of a class smaller by one than a class corresponding to the maximum frequency Fmax. and a difference (Fmax−Fb) is less than or equal to 2.5% between the maximum frequency Fmax and a frequency Fb of a class larger by one than the class corresponding to the maximum frequency Fmax. Accordingly, the peak of the histogram which is the grain size distribution of the tungsten carbide grains is gradual, and the equivalent circle diameters of the WC grains are non-uniform. Therefore, the WC grains are further densified and firmly adhered to each other, and the cutting tool using the cemented carbide can have further excellent processing precision.

In the present specification, when the interval of the class (hereinafter, also referred to as "class N") corresponding to the maximum frequency Fmax is indicated to be more than $(0.1 \times n)$ m and less than or equal to $\{0.1 \times (n+1)\}$ µm (where n is an integer of more than or equal to 0), the interval of the class (hereinafter, also referred to as "class N−1") smaller by one than the class N is indicated to be more than $\{0.1 \times (n-1)\}$ µm and less than or equal to $\{0.1 \times (n)\}$µm. When the interval of the class N is more than $(0.1 \times n)$ µm and less than or equal to $\{0.1 \times (n+1)\}$ µm (where n is an integer of more than or equal to 0), the interval of the class (hereinafter, also referred to as "class N+1") larger by one than the class N is indicated to be more than $\{0.1 \times (n+1)\}$ µm and less than or equal to $\{0.1 \times (n+2)\}$ µm.

When a plurality of maximum frequencies Fmax exist within the first range of the histogram, it is preferable that at least one maximum frequency Fmax satisfies the condition (d), and it is more preferable that all the maximum frequencies Fmax satisfy the condition (d).

The upper limit of the difference (Fmax−Fa) between Fmax and Fa is preferably less than or equal to 2.5%, is more preferably less than or equal to 2.3%, and is further preferably less than or equal to 2.0%. The lower limit of the difference (Fmax−Fa) between Fmax and Fa may be more than or equal to 0%. The expression "the difference between Fmax and Fa is 0%" means that the class N and the class N−1 have the same maximum frequency. The difference (Fmax−Fa) between Fmax and Fa is preferably more than or equal to 0% and less than or equal to 2.5%, is more preferably more than or equal to 0% and less than or equal to 2.3%, and is further preferably more than or equal to 0% and less than or equal to 2.0%.

The upper limit of the difference (Fmax−Fb) between Fmax and Fb is preferably less than or equal to 2.5%, is more preferably less than or equal to 2.3%, and is further preferably less than or equal to 2.0%. The lower limit of the difference (Fmax−Fb) between Fmax and Fb can be more than or equal to 0%. The expression "the difference between Fmax and Fb is 0%" means that the class N and the class N+1 have the same maximum frequency. The difference (Fmax−Fb) between Fmax and Fb is preferably more than or equal to 0% and less than or equal to 2.5%, is more preferably more than or equal to 0% and less than or equal to 2.3%, and is further preferably more than or equal to 0% and less than or equal to 2.0%.

In the present specification, the histogram indicating the distribution of the equivalent circle diameters of the tungsten carbide grains is prepared in the following procedures (A3) to (B3).

(A3) The cemented carbide is captured in images by a scanning electron microscope in accordance with the procedures (A1) and (B1) of the method of measuring the average value of the equivalent circle diameters of the WC grains. Three captured images are prepared. The three images are captured in different image capturing regions. Locations for the image capturing can be arbitrarily set Each of the images is subjected to binarization processing in accordance with the procedure (C1). A measurement visual field having a rectangular shape with a length of 25.3 μm and a width of 17.6 μm is set in each of the three images having been through the binary processing. The equivalent circle diameter (Heywood diameter: the diameter of the circle of equal area) of each of all the tungsten carbide grains in each of the three measurement visual fields is measured.

(B3) Based on the equivalent circle diameters of all the tungsten carbide grains measured in the three measurement visual fields, a histogram is created in which the vertical axis represents frequencies and the horizontal axis represents classes. The frequencies represent, on number basis, the percentages of the tungsten carbide grains belonging to the respective classes with respect to all the tungsten carbide grains, the classes represent the equivalent circle diameters of the tungsten carbide grains, and the interval of each of the classes is 0.1 μm. The interval of each class is represented by more than (0.1×n) μm and less than or equal to {0.1×(n+1)} μm (where n is an integer of more than or equal to 0).

In the measurement performed by the Applicant, it has been confirmed that as long as the measurement is performed on the same sample, even when the measurement is performed a plurality of times with a selected location for the measurement visual field being changed, variation in the measurement results is small and there is no arbitrariness even with the measurement visual field set as desired.

In the present specification, the maximum frequency Fmax is the maximum frequency in the first range in which the equivalent circle diameters are more than 0.3 μm and less than or equal to 1.3 μm in the histogram. In the present specification, the minimum frequency Fmin is a minimum frequency in the first range in which the equivalent circle diameters are more than 0.3 μm and less than or equal to 1.3 μm in the histogram.

Figure 3:
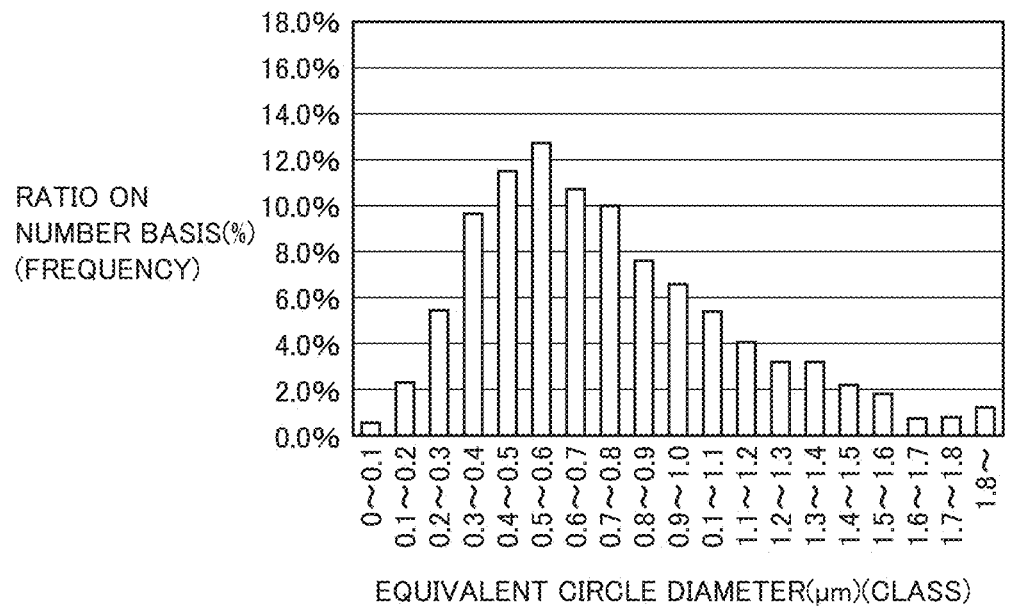
FIG. 3 is a histogram indicating an exemplary distribution of equivalent circle diameters of tungsten carbide grains in the cemented carbide of the present embodiment.
Figure 4:
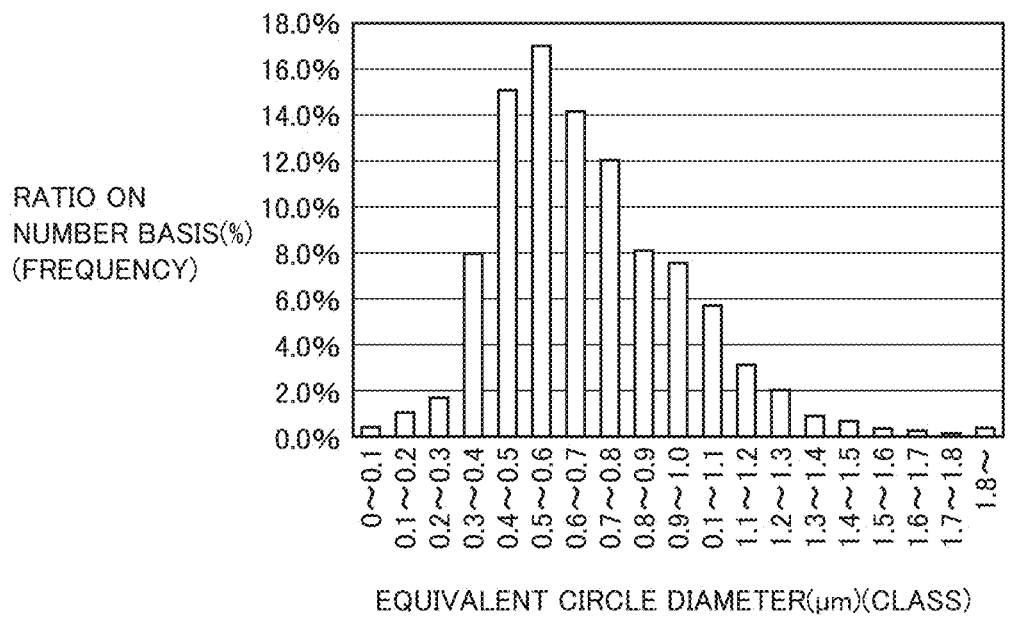
FIG. 4 is a histogram indicating an exemplary distribution of equivalent circle diameters of tungsten carbide grains in a cemented carbide of a comparative example.

Explanation will be made with regard to (a) to (d) above with reference to FIGS. 3 and 4. FIG. 3 is a histogram indicating an exemplary distribution of the equivalent circle diameters of the tungsten carbide grains in the cemented carbide of the present embodiment. Specifically, FIG. 3 is a histogram indicating the distribution of the equivalent circle diameters of the tungsten carbide grains in the cemented carbide of a sample 8 of a below-described example. FIG. 4 is a histogram indicating an exemplary distribution of equivalent circle diameters of tungsten carbide grains in a cemented carbide that does not correspond to the cemented carbide of the present embodiment (that corresponds to a comparative example). Specifically, FIG. 4 is a histogram indicating a distribution of equivalent circle diameters of tungsten carbide grains in a cemented carbide of a sample 15 of the below-described example. In each of FIGS. 3 and 4, the horizontal axis represents classes obtained by segmenting the equivalent circle diameters at intervals of 0.1 μm in ascending order, and the vertical axis represents percentages (%) of tungsten carbide grains belonging to the respective classes with respect to all the tungsten carbide grains on number basis.

In each of FIGS. 3 and 4, the expression "C to D" means more than C and less than or equal to D. Specifically, the expression "0 to 0.1" on the horizontal axis of each of FIGS. 3 and 4 means more than 0 μm and less than or equal to 0.1 μm, and the expression "0.1 to 0.2" means more than 0.1 μm and less than or equal to 0.2 μm.

(FIG. 3)

In FIG. 3, the ratio of the first tungsten carbide grains each having an equivalent circle diameter of less than or equal to 0.3 μm with respect to the whole of the tungsten carbide grains on number basis is less than or equal to 13% (about 8.4%). Therefore, the distribution of the equivalent circle diameters of the tungsten carbide grains shown in FIG. 3 satisfies the above-described condition (a).

In FIG. 3, the ratio of the second tungsten carbide grains each having an equivalent circle diameter of more than 1.3 μm with respect to the whole of the tungsten carbide grains on number basis is less than or equal to 12% (about 9.9%). Therefore, the distribution of the equivalent circle diameters of the tungsten carbide grains shown in FIG. 3 satisfies the above-described condition (b).

In FIG. 3, Fmax/Fmin is less than or equal to 7.0 (Fmax/Fmin=about 4.0). Fmax/Fmin being the ratio of the maximum frequency Fmax (a frequency of about 12.8% corresponding to the equivalent circle diameter of more than 0.5 μm and less than or equal to 0.6 μm) to the minimum frequency Fmin (a frequency of about 3.2% corresponding to a class of more than 1.2 pin and less than or equal to 1.3 μm) in the first range (range in which the equivalent circle diameters are more than 0.3 μm and less than or equal to 1.3 μm) of the histogram. Therefore, the distribution of the equivalent circle diameters of the tungsten carbide grains shown in FIG. 3 satisfies the above-described condition (c).

In FIG. 3, the difference between the maximum frequency Fmax (about 12.8%) and the frequency Fa (about 11.5%) of the class (the equivalent circle diameter of more than 0.4 μm and less than or equal to 0.5 μm) smaller by one than the class (the equivalent circle diameter of more than 0.5 μm and less than or equal to 0.6 μm) corresponding to the maximum frequency Fmax is less than or equal to 2.5% (about 1.3%), and the difference between the maximum frequency Fmax and the frequency Fb (about 10.8%) of the class (the equivalent circle diameter of more than 0.6 μm and less than or equal to 0.7 μm) larger by one than the maximum frequency Fmax is less than or equal to 2.5% (about 2.0%). Therefore, the distribution of the equivalent circle diameters of the tungsten carbide grains shown in FIG. 3 satisfies the above-described condition (d).

(FIG. 4)

In FIG. 4, the ratio of the first tungsten carbide grains each having an equivalent circle diameter of less than or equal to 0.3 μm to the whole of the tungsten carbide grains on number basis is less than or equal to 13% (about 3.4%) Therefore, the distribution of the equivalent circle diameters of the tungsten carbide grains shown in FIG. 4 satisfies the above-described condition (a).

In FIG. 4, the ratio of the second tungsten carbide grains each having an equivalent circle diameter of more than 1.3 μm to the whole of the tungsten carbide grains on number basis is less than or equal to 12% (about 3.1%). Therefore, the distribution of the equivalent circle diameters of the tungsten carbide grains shown in FIG. 4 satisfies the above-described condition (b).

In FIG. 4, in the first range of the histogram (range in which the equivalent circle diameters are more than 0.3 μm and less than or equal to 1.3 μm), Fmax/Fmin is more than 7.0 (about 8.1), Fmax/Fmin being the ratio of the maximum frequency Fmax (a frequency of about 17.1% corresponding to a class of more than 0.5 μm and less than or equal to 0.6 μm) to the minimum frequency Fmin (a frequency of 2.1% corresponding to a class of more than 1.2 μm and less than or equal to 1.3 μm). Therefore, the distribution of the equivalent circle diameters of the tungsten carbide grains shown in FIG. 4 does not satisfy the above-described condition (c).

Second Phase

The second phase includes cobalt. The second phase is a binder phase for binding the tungsten carbide grains of the first phase to each other.

In the present specification, the expression "the second phase includes cobalt (Co)" means that the main component of the second phase is Co. The expression "the main component of the second phase is Co" means that the content ratio of cobalt of the second phase is more than or equal to 80 mass % and less than or equal to 100 mass %. The content ratio of cobalt of the second phase can be measured by ICP emission spectrometry (instrument used herein. ICPS-8100 (trademark) provided by Shimadzu Corporation).

In addition to cobalt, the second phase can include iron (Fe), nickel (Ni), a dissolved material in an alloy (such as chromium (Cr), tungsten (W), or vanadium (V)). The second phase can consist of cobalt and at least one selected from a group consisting of iron, nickel, chromium, tungsten, and vanadium. The second phase can consist of cobalt, at least one selected from a group consisting of iron, nickel, chromium, tungsten, and vanadium, and an inevitable impurity. Examples of the inevitable impurity include manganese (Mn), magnesium (Mg), calcium (Ca), molybdenum (Mo), sulfur (S), titanium (Ti), aluminum (Al), and the like.

Composition of Cemented Carbide

<<Content Ratios of First Phase and Second Phase>>

The cemented carbide consists of: the first phase consisting of the plurality of tungsten carbide grains; and the second phase including cobalt. That is, the total content ratio of the first phase and the second phase of the cemented carbide is 100 volume %. The cemented carbide includes more than or equal to 78 volume % and less than 100 volume % of the first phase and more than 0 volume % and less than or equal to 22 volume % of the second phase. Accordingly, hardness and wear resistance necessary for processing a printed circuit board are exhibited, thereby suppressing occurrence of variation in tool life.

When the content ratio of the first phase of the cemented carbide is mom than or equal to 78 volume %, the hardness of the cemented carbide is improved. The lower limit of the content ratio of the first phase of the cemented carbide is more than or equal to 78 volume %, is preferably more than or equal to 88 volume %, is more preferably more than or equal to 88.5 volume %, and is further preferably more than or equal to 89 volume %. The upper limit of the content ratio of the first phase in the cemented carbide is less than 100 volume %, and in order to improve the fracture resistance, the upper limit is preferably less than or equal to 95 volume %, is more preferably less than or equal to 93 volume %, and is further preferably less than or equal to 91 volume %. The content ratio of the first phase of the cemented carbide is more than or equal to 78 volume % and less than 100 volume %, is preferably more than or equal to 88 volume % and less than or equal to 95 volume %, is more preferably more than or equal to 88.5 volume % and less than or equal to 93 volume %, and is further preferably more than or equal to 89 volume % and less than or equal to 91 volume %.

When the content ratio of the second phase of the cemented carbide is less than or equal to 22 volume %, the hardness of the cemented carbide is improved. The lower limit of the content ratio of the second phase of the cemented carbide is more than 0 volume %, and in order to improve the fracture resistance, the lower limit is preferably more than or equal to 1 volume %, is preferably more than or equal to 5 volume %, is more preferably more than or equal to 7 volume %, and is further preferably more than or equal to 9 volume %. The upper limit of the content ratio of the second phase of the cemented carbide is less than or equal to 22 volume %, is preferably less than or equal to 12 volume %, is more preferably less than or equal to 11.5 volume %, and is further preferably less than or equal to 11 volume %. The content of the second phase of the cemented carbide is more than 0 volume % and less than or equal to 22 volume %, is preferably more than or equal to 1 volume % and less than or equal to 22 volume %, is preferably more than or equal to 1 volume % and less than or equal to 12 volume %, is preferably more than or equal to 5 volume % and less than or equal to 12 volume %, is more preferably more than or equal to 7 volume % and less than or equal to 11.5 volume %, and is further preferably more than or equal to 9 volume % and less than or equal to 11 volume %.

The content ratio of the first phase of the cemented carbide is preferably more than or equal to 88 volume % and less than or equal to 95 volume %, and the content ratio of the second phase is preferably more than or equal to 5 volume % and less than or equal to 12 volume %. The content ratio of the first phase of the cemented carbide is more preferably more than or equal to 88.5 volume % and less than or equal to 93 volume %, and the content ratio of the second phase is more preferably more than or equal to 7 volume % and less than or equal to 11.5 volume %. The content ratio of the first phase of the cemented carbide is preferably more than or equal to 89 volume % and less than or equal to 91 volume %, and the content ratio of the second phase is more preferably more than or equal to 9 volume % and less than or equal to 11 volume %.

In the present specification, the expression "the cemented carbide consists of the first phase and the second phase" means that the cemented carbide can include other phase(s) and/or inevitable impuriti(es) in addition to the first phase and the second phase, as long as the effects of the present disclosure are exhibited. Examples of components of the other phase(s) include a concentrated phase of chromium (Cr), vanadium (V) or carbon (C) originated from $Cr_3C_2$ or VC added as a grain growth inhibitor in the production process of the cemented carbide. Examples of the inevitable impuriti(es) include iron, molybdenum, and sulfur.

The respective content ratios of the first phase and the second phase of the cemented carbide are measured in the following procedures (A4) to (B4).

(A4) The cemented carbide is captured in images by a scanning electron microscope in accordance with the procedures (A1) and (B1) of the method of measuring the average value of the equivalent circle diameters of the WC grains. Three captured images are prepared. The three images are captured in different image capturing regions. Locations for the image capturing can be arbitrarily set. Each of the images is subjected to binarization processing in accordance with the procedure (C1). A measurement visual field having a rectangular shape with a length of 25.3 µm and a width of 17.6 µm is set in each of the three images having been through the binary processing. In each of the three measurement visual fields, the area % of each of the first phase and the second phase is measured using the whole of the measurement visual field as a denominator.

(B4) In the present specification, the average of the area % of the first phase obtained in the three measurement visual fields is defined as the content ratio (volume %) of the first phase of the cemented carbide. In the present specification, the average of the area % of the second phase obtained in the three measurement visual fields is defined as the content ratio (volume %) of the second phase of the cemented carbide.

In the measurement performed by the Applicant, it has been confirmed that as long as the measurement is performed on the same sample, even when the measurement is performed a plurality of times with a selected location for the measurement visual field being changed, variation in the measurement results is small and there is no arbitrariness even with the measurement visual field set as desired <<Content Ratio of Cobalt>>

The content ratio of cobalt in the cemented carbide of the present embodiment is more than 0 mass % and less than or equal to 10 mass %. Accordingly, the cemented carbide can have high hardness and excellent wear resistance.

The upper limit of the content ratio of cobalt in the cemented carbide is preferably less than or equal to 9 mass % or less than or equal to 8 mass %. The lower limit of the content ratio of cobalt in the cemented carbide is preferably more than or equal to 1 mass % or more than or equal to 2 mass %. The content ratio of cobalt in the cemented carbide is preferably more than 0 mass % and less than or equal to 9 mass %, more than 0 mass % and less than or equal to 8 mass %, more than or equal to 1 mass % and less than or equal to 9 mass %, or more than or equal to 2 mass % and less than or equal to 8 mass %.

The content of cobalt in the cemented carbide is measured by ICP emission spectrometry.

<<Content Ratio of Chromium>>

The cemented carbide of the present embodiment includes chromium (Cr), and the content ratio of chromium in the cemented carbide is preferably more than or equal to 0.15 mass % and less than or equal to 1.00 mass %. Chromium has a function of inhibiting grain growth of the tungsten carbide grains. When the content ratio of chromium in the cemented carbide is more than or equal to 0.15 mass % and less than or equal to 1.00 mass %, fine tungsten carbide particles serving as a source material can be effectively suppressed from remaining unchanged in the obtained cemented carbide, and generation of coarse grains can be effectively suppressed, thereby attaining an improved tool life.

The upper limit of the content ratio of chromium in the cemented carbide is preferably less than or equal to 0.95 mass % and less than or equal to 0.90 mass %. The lower limit of the content ratio of chromium in the cemented carbide is preferably more than or equal to 0.20 mass % and more than or equal to 0.25 mass % The content ratio of chromium in the cemented carbide is preferably more than or equal to 0.20 mass % and less than or equal to 0.95 mass % or more than or equal to 0.25 mass % and less than or equal to 0.90 mass %.

The content ratio of chromium in the cemented carbide is measured by ICP emission spectrometry.

<<Percentage of Chromium with Respect to Cobalt on Mass Basis>>

In the cemented carbide of the present embodiment, the percentage of chromium with respect to cobalt on mass basis is preferably more than or equal to 5% and less than or equal to 10%. Chromium has a function of inhibiting grain growth of the tungsten carbide grains. Further, chromium is dissolved in cobalt in the solid state to promote generation of lattice strain of cobalt. Therefore, when the cemented carbide includes the above-described content ratio of chromium, the fracture resistance is further improved.

On the other hand, when the amount of chromium is excessive, chromium may be precipitated as carbide to serve as a starting point of breakage. When the percentage of chromium with respect to cobalt on mass basis is more than or equal to 5% and less than or equal to 10%, the precipitation of carbide of chromium is less likely to occur, thereby obtaining an effect of improving fracture resistance.

When the percentage of chromium with respect to cobalt on mass basis is less than or equal to 10%, a degree of the function of inhibiting grain growth becomes appropriate, with the result that an amount of tungsten carbide grains each having an equivalent circle diameter of more than 1.3 μm in the cemented carbide can be suppressed from becoming excessive.

The lower limit of the percentage of chromium with respect to cobalt on mass basis is preferably more than or equal to 5%, and is more preferably more than or equal to 7%. The percentage of chromium with respect to cobalt on mass basis is preferably less than or equal to 10%, and is more preferably less than or equal to 9%. The percentage of chromium with respect to cobalt on mass basis can be more than or equal to 5% and less than or equal to 10%, or can be more than or equal to 7% and less than or equal to 9%.

<<Content Ratio of Vanadium>>

The content ratio of vanadium on mass basis in the cemented carbide of the present embodiment is preferably more than or equal to 0 ppm and less than 2000 ppm. That is, the cemented carbide of the present disclosure preferably includes (a) no vanadium or (b) a content ratio of less than 2000 ppm of vanadium on mass basis when vanadium is included.

Since vanadium has a function of inhibiting grain growth, vanadium has been used in production of a conventional ultrafine-grain cemented carbide. However, when vanadium is added to inhibit grain growth, fine tungsten carbide particles used as a source material tend to remain unchanged in the obtained cemented carbide.

As a result of diligent study on production conditions, the present inventors have newly found a production condition under which fine tungsten carbide particles serving as a source material can be effectively suppressed from remaining in the obtained cemented carbide and coarse grains can be effectively suppressed from being generated even when no vanadium is added or when a small amount of vanadium is added. Details of the production condition will be described later.

The upper limit of the content ratio of vanadium in the cemented carbide is less than 2000 ppm, and is preferably less than or equal to 1900 ppm, less than or equal to 1200 ppm, less than or equal to 1000 ppm, less than or equal to 500 ppm, or less than 100 ppm. The lower limit of the content ratio of vanadium in the cemented carbide is 0 ppm because a smaller content ratio of vanadium in the cemented carbide is more preferable. The content ratio of vanadium in the cemented carbide can be more than or equal to 0 ppm and less than 2000 ppm, more than or equal to 0 ppm and less than or equal to 1900 ppm, more than or equal to 0 ppm and less than or equal to 1200 ppm, more than or equal to 0 ppm and less than or equal to 1000 ppm, more than or equal to 0 ppm and less than or equal to 500 ppm, or more than or equal to 0 ppm and less than 100 ppm.

The content ratio of vanadium in the cemented carbide is measured by ICP emission spectrometry.

Method of Producing Cemented Carbide

As a method of obtaining non-uniform equivalent circle diameters of the WC grains in the cemented carbide, it is conceivable to use, as source materials, two types of WC powders having different average particle sizes. Further, in order that the percentage of the first tungsten carbide grains each having an equivalent circle diameter of less than or equal to 0.3 μm on number basis becomes less than or equal to 13% in the WC grains included in the cemented carbide, it is conceivable to perform sintering under a condition that promotes grain growth. Specifically, it is conceivable to use no grain growth inhibitor, perform sintering at a high temperature, or the like.

However, when the two types of WC powders having different average particle sizes are used and sintering is performed under the condition that promotes grain growth, even though the particle sizes of the WC particles in the source material powders are different, grains become coarse as a whole due to grain growth during the sintering, with the result that the grain sizes of the WC grains become uniform in the obtained cemented carbide, disadvantageously. As a result of diligent study on production conditions for obtaining the cemented carbide of the present embodiment, the present inventors newly found an optimal production condition. Details of the method of producing the cemented carbide of the present embodiment will be described below.

Representatively, the cemented carbide of the present embodiment can be produced by performing a preparation step for source material powders, a mixing step, a shaping step, a sintering step, and a cooling step in this order. Hereinafter, each step will be described.

<<Preparation Step>>

The preparation step is a step of preparing source material powders for all the materials of the cemented carbide Examples of essential source material powders include: a tungsten carbide powder serving as a source material of the first phase; and a cobalt (Co) powder serving as a source material of the second phase. Further, a chromium carbide ($Cr_3C_2$) powder can be prepared as a grain growth inhibitor as required. Commercially available tungsten carbide powder, cobalt powder, and chromium carbide powder can be used.

As the tungsten carbide powder, a tungsten carbide powder (hereinafter, also referred to as "WC powder") having non-uniform particle sizes is prepared. It should be noted that when the WC powder includes a large amount of ultrafine WC particles each having a particle size greatly different from the average particle size of the WC powder, grains become coarse as a whole due to grain growth resulting from sintering, with the result that the grain sizes of the WC grains may become uniform in the cemented carbide. Therefore, as the WC powder, there is employed a WC powder in which the particle sizes are non-uniform in a narrow range (a range of particle sizes of more than or equal to 0.6 μm and less than or equal to 1.4 μm) and in which substantially no ultrafine WC particles each having a particle size of less than 0.2 μm is included. Specifically, a WC powder is prepared in which the average particle size thereof is 0.7 to 1.3 μm and a distribution of the particle sizes on volume basis is such that a ratio d30/d70 of 30% cumulative volume particle size d30 and 70% cumulative volume particle size d70 is less than or equal to 0.7 and 5% cumulative volume particle size d$ is more than or equal to 0.5 μm. The WC powder in which the average particle size is 0.7 to 1.3 μm and ratio d30/d70 is less than or equal to 0.7 is non-uniform in the narrow range of particle sizes (range of particle sizes of more than or equal to 0.6 μm and less than or equal to 1.4 μm). The WC powder in which d5 is more than or equal to 0.5 μm includes substantially no ultrafine WC particles each having a particle size of less than 0.2 μm.

In the present specification, the average particle size of the source material powder means the average particle size measured by an FSSS (Fisher Sub-Sieve Sizer) method. The average particle size is measured using "Sub-Sieve Sizer model 95" (trademark) provided by Fisher Scientific. The particle size of each WC particle included in the WC powder and the distribution of the particle sizes of the WC powder are measured using a particle size distribution measurement apparatus (trade name. MT3300EX) provided by Microtrac.

The average particle size of the cobalt powder can be more than or equal to 0.5 μm and less than or equal to 1.5 μm. The average particle size of the chromium carbide powder can be more than or equal to 1.0 μm and less than or equal to 2.0 μm. These average particle sizes are measured using "Sub-Sieve Sizer model 95" (trademark) produced by Fisher Scientific.

In the method of producing the cemented carbide of the present embodiment, vanadium carbide (VC) powder generally used in the production of a conventional fine-grain cemented carbide and having an effect of highly inhibiting grain growth is not used, or a small amount of such vanadium carbide, if any, is used (for example, the content ratio of vanadium carbide on mass basis in the source material powder is less than 2000 ppm) When a large amount of vanadium is added to the source material powder, fine tungsten carbide particles (particle size of 0.1, to 0.3 μm) in the source material remain unchanged in the obtained cemented carbide. In the present embodiment, since no or a small amount of vanadium carbide (VC) powder, if any, is used, fine WC particles can be suppressed from remaining in the obtained cemented carbide.

<<Mixing Step>>

The mixing step is a step of mixing the source material powders prepared in the preparation step. By the mixing step, a powder mixture in which the source material powders are mixed is obtained. The content ratio of each source material powder of the powder mixture is appropriately adjusted in consideration of the content ratio of each component such as the first phase or the second phase of the cemented carbide.

The content ratio of the tungsten carbide powder in the powder mixture can be, for example, more than or equal to 88.60 mass % and less than 99.83 mass %.

The content ratio of the cobalt powder in the powder mixture can be, for example, more than 0 mass % and less than or equal to 10 mass %.

The content ratio of the chromium carbide powder in the powder mixture can be, for example, more than or equal to 0.17 mass % and less than or equal to 1.15 mass %.

As a mixing method, there is used a method by which the state in which the particle sizes of the WC powder can be maintained to be non-uniform in the powder mixture after the mixing Specifically, a ball mill is used in the mixing method using the ball mill, each of the WC particles in the WC powder can be suppressed from being pulverized. A mixing time can be, for example, 15 to 36 hours.

When a mixing method (for example, attritor) involving strong pulverization force is used, even though the particle sizes of the WC powder serving as the source material are non-uniform, the whole of the WC particles are pulverized finely by the mixing, with the result that the particle sizes of the WC powder after the mixing becomes fine and uniform. Therefore, in the production method of the present embodiment, no mixing method involving strong pulverization force is employed.

After the mixing step, the powder mixture can be granulated as required By granulating the powder mixture, the powder mixture is facilitated to be introduced into a die or mold in the below-described shaping step. For the granulation, a known granulation method can be applied, and for example, a commercially available granulator such as a spray dryer can be used.

<<Shaping Step>>

The shaping step is a step of shaping the powder mixture obtained in the mixing step into a predetermined shape to obtain a shaped material. For shaping method and shaping condition in the shaping step, general method and condition are employed and there is no particular limitation therefor. The predetermined shape is, for example, a cutting tool shape (for example, a shape of a small-diameter drill).

<<Sintering Step>>

The sintering step is a step of sintering the shaped material obtained in the shaping step to obtain a cemented carbide. In the method of producing the cemented carbide of the present disclosure, a sintering temperature can be 1350 to 1450° C. Accordingly, the equivalent circle diameters of the WC grains in the cemented carbide can be non-uniform. Further, coarse WC grains can be suppressed from being generated. Further, the content ratio of fine tungsten carbide grains in the obtained cemented carbide can be reduced.

When the sintering temperature is less than 1350° C., the grain growth is inhibited, with the result that the content ratio of fine tungsten carbide grains in the obtained cemented carbide tends to be increased. On the other hand, when the sintering temperature is more than 1450° C., abnormal grain growth tends to be likely to occur.

<<Cooling Step>>

The cooling step is a step of cooling the cemented carbide after completion of the sintering. For a cooling condition, a general condition may be employed and there is no particular limitation therefor.

Second Embodiment: Cutting Tool

A cutting tool of the present embodiment includes a cutting edge composed of the cemented carbide of the first embodiment. In the present specification, the term "cutting edge" refers to a portion involved in cutting, and refers to a region of the cemented carbide surrounded by a cutting edge ridgeline and an imaginary plane having a distance of 2 mm from the cutting edge ridgeline to the cemented carbide side along a line perpendicular to a tangent of the cutting edge ridgeline.

Figure 5:
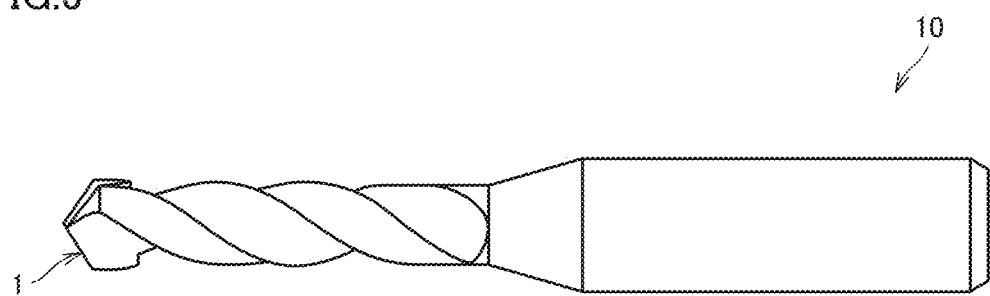
FIG. 5 is a diagram showing an exemplary cutting tool (small-diameter drill) according to the present embodiment.

Examples of the cutting tool include a cutting bite, a drill, an end mill, an indexable cutting insert for milling, an indexable cutting insert for turning, a metal saw, a gear cutting tool, a reamer, or a tap. In particular, the cutting tool of the present embodiment can exhibit an excellent effect when the cutting tool of the present embodiment is a small-diameter drill 10 for processing a printed circuit board as shown in FIG. 5. A cutting edge 1 of small-diameter drill 10 shown in FIG. 5 is composed of the cemented carbide of the first embodiment.

The cemented carbide of the present embodiment may constitute the whole or part of these tools. Here, the expression "constitute part of" indicates an embodiment in which the cemented carbide of the present embodiment is brazed onto a predetermined position of an arbitrary substrate and serves as a cutting edge portion.

<<Hard Film>>

The cutting tool according to the present embodiment may further include a hard film that covers at least a portion of the surface of the substrate composed of the cemented carbide. As the hard film, for example, diamond-like carbon or diamond can be used.

Clause 1

The total content ratio of the first phase and the second phase of the cemented carbide of the present disclosure is preferably 100 volume %.

The cemented carbide of the present disclosure preferably consists of the first phase, the second phase, and one or both of the other phase and an inevitable impurity.

The cemented carbide of the present disclosure preferably consists of the first phase, the second phase, and the inevitable impurity.

Clause 2

In the cemented carbide of the present disclosure. Fmax/Fmin is preferably less than or equal to 6.0.

In the cemented carbide of the present disclosure. Fmax/Fmin is preferably less than or equal to 5.0.

In the cemented carbide of the present disclosure, Fmax/Fmin is preferably more than or equal to 2.0 and less than or equal to 7.0.

In the cemented carbide of the present disclosure, Fmax/Fmin is preferably more than or equal to 2.0 and less than or equal to 6.0.

In the cemented carbide of the present disclosure, Fmax/Fmin is preferably more than or equal to 2.0 and less than or equal to 5.0.

Clause 3

The content ratio of cobalt in the cemented carbide of the present disclosure is preferably more than 0 mass % and less than or equal to 10.0 mass %.

The content ratio of cobalt in the cemented carbide of the present disclosure is preferably more than 0 mass % a and less than or equal to 9.0 mass %.

The content ratio of cobalt in the cemented carbide of the present disclosure is preferably more than 0 mass % and less than or equal to 8.0 mass %.

The content ratio of cobalt in the cemented carbide of the present disclosure is preferably more than 1.0 mass % and less than or equal to 9.0 mass %.

The content ratio of cobalt in the cemented carbide of the present disclosure is preferably more than 2.0 mass % and less than or equal to 8.0 mass %.

Clause 4

In the cemented carbide of the present disclosure, the percentage of chromium with respect to cobalt on mass basis is preferably more than or equal to 5.0% and less than or equal to 10.0%.

In the cemented carbide of the present disclosure, the percentage of chromium with respect to cobalt on mass basis is preferably more than or equal to 7.0% and less than or equal to 9.0%.

Example

The present embodiment will be described more specifically with reference to examples. However, the present embodiment is not limited by these examples.

In the present example, cemented carbides of samples 1 to 15 were produced by changing types and blending ratios of source material powders. Small-diameter drills having cutting edges composed of the cemented carbides were produced and evaluated.

Preparation of Samples

<<Preparation Step>>

As source material powders, powders having compositions shown in the column "Source Materials" in Table 1 were prepared. A plurality of tungsten carbide (WC) powders having different average particle sizes and different particle size distributions were prepared. The average particle size as well as d30/d70 and d5 indicating the distribution in the WC powder are indicated as in the columns "Average Particle Size (μm)", "d30/d70" and "d5 (μm)" of the "WC Powder" of the "Source Material" in Table 1, respectively.

The average particle size of the cobalt (Co) powder is 1 μm, the average particle size of the chromium carbide ($Cr_3C_2$) powder is 1 μm, and the average particle size of the vanadium carbide (VC) powder is 0.8 μm. The Co powder, $Cr_3C_2$ powder, and VC powder are commercially available products.

<<Mixing Step>>

The source material powders were mixed in blending amounts shown in "Mass %" of "Source Materials" in Table 1, thereby preparing a powder mixture. "Mass %" in the column "Source Materials" in Table 1 indicates the ratio of each source material powder to the total mass of the source material powder. The mixing was performed by a ball mill for 15 hours. The resulting powder mixture was spray-dried to obtain a granulated powder <<Shaping Step>>

The obtained granulated powder was pressed and shaped to produce a shaped material having a round bar shape with <p of 3.4 mm.

<<Sintering Step>>

The shaped material was placed in a sintering furnace and was sintered in vacuum at a temperature and a time shown in the column "Sintering Temperature/Time" in Table 1. For example, in sample 1, sintering was performed in vacuum at 1420'C for 1 hour.

<<Cooling Step>>

After completion of the sintering, slow cooling was performed in an argon (Ar) gas atmosphere, thereby obtaining a cemented carbide.

Evaluations

For each of the cemented carbides of the samples, the content ratios of the first phase and the second phase, the average grain size of the WC grains, the content ratio of the first WC grains, the content ratio of the second WC grains, Fmin, Fmax, Fmax/Fmin, Fmax-Fa, Fmax-Fb, the content ratio of cobalt, the content ratio of chromium, the percentage of chromium with respect to cobalt on mass basis, and the content ratio of vanadium were measured.

<<Content Ratios of First Phase and Second Phase>>

The content ratios of the first phase and the second phase of the cemented carbide of each sample were measured. Since the specific measurement method is described in the first embodiment, the measurement method will not be described repeatedly. Results are shown in the columns "First Phase (Volume %)" and "Second Phase (Volume %)" of the "Cemented Carbide" in Table 2.

<<Average Grain Size of WC Grains>>

The average grain size of the WC grains of the cemented carbide of each of the samples was measured. Since the specific measurement method is described in the first embodiment, the measurement method will not be described repeatedly. Results are shown in the column "Average Grain Size (μm)" of "WC Grains" of "Cemented Carbide" in Table 1.

<<Content Ratio of First WC Grains, Content Ratio of Second WC Grains, Fmin, Fmax, Fmax/Fmin, Fmax-Fa, Fmax-Fb>>

For each of the cemented carbides of the samples, the distribution of the equivalent circle diameters of the tungsten carbide grains was measured, and the content ratio of the first WC grains, the content ratio of the second WC grains, Fmin, Fmax, Fmax/Fmin, Fmax-Fa, and Fmax-Fb were calculated. Since the specific measurement method and the specific calculation method are described in the first embodiment, the measurement method and the calculation method will not be described repeatedly. Results are shown in the columns "First WC Grains (%)" "Second WC Grains (%)", "Fmin (%)", "Fmax (%)", "Fmax/Fmin", "Fmax-Fa (%)", and "Fmax-Fb (%)" of "WC Grains" of "Cemented Carbide" in Table 2

TABLE 1

| | Source Materials | | | | | | | | |
|---|---|---|---|---|---|---|---|---|---|
| | WC Particles | | | | Co Powder | $Cr_3C_2$ Powder | VC Powder | | Sintering |
| Sample No. | Average Particle Size (μm) | d30/d70 | d5 (μm) | Mass % | Mass % | Mass % | Mass % | Mixing Method/Time | Temperature/Time |
| 1 | 0.9 | 0.6 | 0.7 | 89.54 | 10 | 0.46 | 0 | Ball Mill/15 Hours | 1420° C./1 Hour |
| 2 | 0.9 | 0.6 | 0.7 | 98.31 | 1 | 0.46 | 0.23 | Ball Mill/15 Hours | 1420° C./1 Hour |
| 3 | 0.7 | 0.5 | 0.5 | 94.83 | 5 | 0.17 | 0 | Ball Mill/15 Hours | 1420° C./1 Hour |
| 4 | 1.3 | 0.6 | 1.0 | 93.85 | 5 | 1.15 | 0 | Ball Mill/15 Hours | 1420° C./1 Hour |
| 5 | 0.8 | 0.5 | 0.6 | 94.56 | 5 | 0.29 | 0.15 | Ball Mill/15 Hours | 1450° C./1 Hour |
| 6 | 0.9 | 0.7 | 0.8 | 94.42 | 5 | 0.58 | 0 | Ball Mill/15 Hours | 1420° C./1 Hour |
| 7 | 0.8 | 0.7 | 0.7 | 94.54 | 5 | 0.46 | 0 | Ball Mill/15 Hours | 1450° C./1 Hour |
| 8 | 0.9 | 0.4 | 0.7 | 94.54 | 5 | 0.46 | 0 | Ball Mill/15 Hours | 1420° C./1 Hour |
| 9 | 0.9 | 0.6 | 0.7 | 97.04 | 2.5 | 0.46 | 0 | Ball Mill/15 Hours | 1420° C./1 Hour |
| 10 | 0.9 | 0.6 | 0.7 | 94.04 | 5.5 | 0.46 | 0 | Ball Mill/15 Hours | 1420° C./1 Hour |
| 11 | 0.9 | 0.6 | 0.7 | 97.04 | 2.5 | 0.46 | 0 | Ball Mill/15 Hours | 1420° C./1 Hour |
| 12 | 0.9 | 0.6 | 0.7 | 100.00 | 0 | 0 | 0 | Ball Mill/15 Hours | 1420° C./1 Hour |
| 13 | 0.6 | 0.5 | 0.4 | 94.54 | 5 | 0.46 | 0 | Ball Mill/15 Hours | 1420° C./1 Hour |
| 14 | 1.4 | 0.7 | 1.3 | 94.54 | 5 | 0.46 | 0 | Ball Mill/15 Hours | 1420° C./1 Hour |
| 15 | 0.9 | 0.8 | 0.5 | 94.54 | 5 | 0.46 | 0 | Ball Mill/15 Hours | 1420° C./1 Hour |

<<Content Ratio of Cobalt, Content Ratio of Chromium, Percentage of Chromium with respect to Cobalt on Mass Basis, Content Ratio of Vanadium>>

For each of the cemented carbides of the samples, the content ratio of cobalt, the content ratio of chromium, the percentage of chromium with respect to cobalt on mass basis, and the content ratio of vanadium were measured. Since a specific measurement method is described in the first embodiment, the measurement method will not be described repeated Results are shown in the columns "Co (Mass %)", "Cr (Mass %)", "Cr/Co (%)" and "V (ppm)" of "Cemented Carbide" in Table 2.

"Processing Precision ave+3σ" of "Cutting Test" in Table 2. When "Fractured" is described in the column "Processing Precision ave+3σ", it is indicated that rupture has occurred in all the three drills before the end of the formation of the 4000 holes.

TABLE 2

| | Cemented Carbide | | | | | | | | | | | | | | Cutting Test |
|---|---|---|---|---|---|---|---|---|---|---|---|---|---|---|---|
| | | | | WC Particles | | | | | | | | | | | |
| Sample No | First Phase Volume % | Second Phase Volume % | Average Particle Size μm | First WC Particles % | Second WC Particles % | Fmin % | Fmax % | Fmax/Fmin | Fmax-Fa % | Fmax-Fb % | Co Mass % | Cr Mass % | Cr/Co % | V ppm | Processing Precision ave + 3σ μm |
| 1 | 78.0 | 22.0 | 0.8 | 8.5 | 10.2 | 2.9 | 15.1 | 5.2 | 1.5 | 2.1 | 10.0 | 0.40 | 4.0 | 0 | 70.8 |
| 2 | 99.0 | 1.0 | 0.55 | 11.9 | 7.8 | 3.3 | 13.5 | 4.1 | 1.1 | 2.2 | 1.0 | 0.40 | 40.0 | 1900 | 50.8 |
| 3 | 89.4 | 10.6 | 0.5 | 10.4 | 9.8 | 2.5 | 14.8 | 5.9 | 1.5 | 2.2 | 5.0 | 0.15 | 3.0 | 0 | 62.9 |
| 4 | 88.8 | 11.2 | 1.2 | 5.1 | 11.9 | 3.4 | 13.8 | 4.1 | 2.1 | 1.5 | 5.0 | 1.00 | 20.0 | 0 | 50.3 |
| 5 | 89.6 | 10.4 | 0.6 | 13.0 | 12.0 | 3.0 | 14.0 | 4.7 | 1.7 | 2.0 | 5.0 | 0.25 | 5.0 | 0 | 63.5 |
| 6 | 89.9 | 10.1 | 0.7 | 4.0 | 4.0 | 2.3 | 13.7 | 6.0 | 2.2 | 2.4 | 5.0 | 0.50 | 10.0 | 0 | 57.1 |
| 7 | 89.8 | 10.2 | 0.7 | 5.4 | 8.1 | 2.1 | 14.7 | 7.0 | 2.3 | 2.5 | 5.0 | 0.40 | 8.0 | 0 | 60.7 |
| 8 | 89.8 | 10.2 | 0.7 | 8.4 | 9.9 | 3.2 | 12.8 | 4.0 | 1.3 | 2.0 | 5.0 | 0.40 | 8.0 | 0 | 48.8 |
| 9 | 95.0 | 5.0 | 0.6 | 11.0 | 8.2 | 3.2 | 13.3 | 4.2 | 1.2 | 2.3 | 2.5 | 0.40 | 16.0 | 0 | 53.9 |
| 10 | 88.0 | 12.0 | 0.6 | 10.1 | 8.9 | 3.0 | 13.0 | 4.3 | 1.2 | 2.3 | 5.5 | 0.40 | 7.3 | 0 | 54.1 |
| 11 | 75.0 | 25.0 | 0.8 | 8.1 | 2.5 | 2.2 | 15.6 | 7.1 | 2.4 | 2.6 | 2.5 | 0.40 | 16.0 | 0 | 74.7 |
| 12 | 100.0 | 0.0 | 0.6 | 12.2 | 7.4 | 3.5 | 13.3 | 3.8 | 1.0 | 1.9 | 0.0 | 0.00 | — | 0 | Fractured |
| 13 | 89.8 | 10.2 | 0.4 | 18.0 | 11.8 | 2.8 | 14.7 | 5.3 | 1.0 | 2.3 | 5.0 | 0.40 | 8.0 | 0 | 71.1 |
| 14 | 89.9 | 10.1 | 1.3 | 3.9 | 14.6 | 3.4 | 13.7 | 4.0 | 2.4 | 1.2 | 5.0 | 0.40 | 8.0 | 0 | Fractured |
| 15 | 89.8 | 10.2 | 0.7 | 3.4 | 3.1 | 2.1 | 17.1 | 8.1 | 1.9 | 2.9 | 5.0 | 0.40 | 8.0 | 0 | 71.0 |

Cutting Test

A round bar of each sample was processed to produce a small-diameter drill (rotating tool for processing a printed circuit board) having a cutting edge diameter e of 0.35 mm. Currently, a drill is normally shaped by press-fitting only a cutting edge portion into a stainless steel shank; however, for the sake of evaluation, a drill was produced by processing the tip of the round bar having P of 3.4 mm to provide a cutting edge. The drill was used to perform a hole formation process onto a commercially available in-vehicle printed circuit board. Conditions for the hole formation were as follows, the rotation speed was 100 krpm and the feed rate was 1.9 m/min. Processing precision was measured after forming 4000 holes. Specifically, a measurement apparatus of an optical system was used to measure an amount of deviation between the position of each formed hole on the rear side of the substrate and the position at which the hole was originally intended to be formed, and average value ave (unit: μm) and standard deviation α (unit: μm) of the respective amounts of deviations were measured. The value of "ave+3σ" was calculated based on average value ave and standard deviation σ. The value of "ave+3σ" was employed as an index for the processing precision. It is indicated that as the processing precision (ave+3σ) is smaller, the processing precision of the drill is more excellent.

The hole formation process was performed using three drills. The average value of the respective processing precisions (ave+3a) of the three drills is shown in the column Review Each of the cemented carbides and drills of samples 1 to 10 correspond to an example of the present disclosure. Each of the cemented carbides and drills of samples 11 to 15 correspond to a comparative example. It was confirmed that each of the drills of samples 1 to 10 (examples of the present disclosure) had more excellent processing precision than those of the drills of samples 11 to 15.

Heretofore, the embodiments and examples of the present disclosure have been illustrated, but it has been initially expected to appropriately combine the configurations of the embodiments and examples and modify them in various manners.

The embodiments and examples disclosed herein are illustrative and non-restrictive in any respect. The scope of the present invention is defined by the terms of the claims, rather than the embodiments and examples described above, and is intended to include any modifications within the scope and meaning equivalent to the terms of the claims.

REFERENCE SIGNS LIST

1: cutting edge
10: small-diameter drill

The invention claimed is:

1. A cemented carbide consisting of: a first phase consisting of a plurality of tungsten carbide grains; and a second phase including cobalt, wherein
the cemented carbide includes more than or equal to 78 volume % and less than 100 volume % of the first phase, and more than 0 volume % and less than or equal to 22 volume % of the second phase,
an average value of equivalent circle diameters of the tungsten carbide grains is more than or equal to 0.5 μm and less than or equal to 1.2 μm, on number basis, the tungsten carbide grains include less than or equal to 13% of first tungsten carbide grains each having an equivalent circle diameter of less than or equal to 0.3 µm, on number basis, the tungsten carbide grains include less than or equal to 12% of second tungsten carbide grains each having an equivalent circle diameter of more than 1.3 µm, in a first range of a histogram indicating a distribution of the equivalent circle diameters of the tungsten carbide grains, Fmax/Fmin is less than or equal to 7.0, Fmax/Fmin being a ratio of a maximum frequency Fmax to a minimum frequency Fmin, classes on a horizontal axis of the histogram represent the equivalent circle diameters of the tungsten carbide grains, and an interval of each of the classes is 0.1 µm, frequencies on a vertical axis of the histogram represent, on number basis, percentages of tungsten carbide grains belonging to the respective classes with respect to all the tungsten carbide grains, the first range is a range in which the equivalent circle diameters of the tungsten carbide grains are more than 0.3 µm and less than or equal to 1.3 µm, the maximum frequency Fmax is a maximum frequency in the first range, the minimum frequency Fmin is a minimum frequency in the first range, and a content ratio of cobalt in the cemented carbide is more than 0 mass % and less than or equal to 10 mass %.

2. The cemented carbide according to claim 1, wherein the cemented carbide includes more than or equal to 5 volume % and less than or equal to 12 volume % of the second phase.

3. The cemented carbide according to claim 1, wherein a content ratio of chromium in the cemented carbide is more than or equal to 0.15 mass % and less than or equal to 1.00 mass %.

4. The cemented carbide according to claim 3, wherein a percentage of the chromium with respect to the cobalt on mass basis is more than or equal to 5% and less than or equal to 10%.

5. The cemented carbide according to claim 1, wherein a content ratio of vanadium in the cemented carbide on mass basis is more than or equal to 0 ppm and less than 2000 ppm.

6. The cemented carbide according to claim 1, wherein
a difference is less than or equal to 2.5% between the maximum frequency Fmax and a frequency Fa of a class smaller by one than a class corresponding to the maximum frequency Fmax, and
a difference is less than or equal to 2.5% between the maximum frequency Fmax and a frequency Fb of a class larger by one than the class corresponding to the maximum frequency Fmax.

7. A cutting tool comprising a cutting edge composed of the cemented carbide according to claim 1.

8. The cutting tool according to claim 7, wherein the cutting tool is a rotating tool for processing a printed circuit board.

* * * * *